United States Patent [19]

Watanabe et al.

[11] Patent Number: 5,067,437
[45] Date of Patent: Nov. 26, 1991

[54] APPARATUS FOR COATING OF SILICON SEMICONDUCTOR SURFACE

[75] Inventors: Tohru Watanabe; Katsuya Okumura, both of Yokohama, Japan

[73] Assignee: Kabushiki Kaisha Toshiba, Kawasaki, Japan

[21] Appl. No.: 329,847

[22] Filed: Mar. 28, 1989

[30] Foreign Application Priority Data

Mar. 28, 1988 [JP] Japan ................. 63-73628

[51] Int. Cl.[5] ............................................. C23C 16/02
[52] U.S. Cl. .................................... 118/715; 118/719;
118/724; 156/345; 156/643; 204/192.1;
204/298.02; 204/298.25; 427/248.1; 427/255;
427/309; 437/228
[58] Field of Search ............... 118/715, 719, 723, 724;
156/345, 643; 204/192.1, 192.12, 298.02,
298.25; 427/309, 248.1, 255; 437/228

[56] References Cited

U.S. PATENT DOCUMENTS

| 4,138,306 | 2/1979 | Niwa | 156/345 |
|---|---|---|---|
| 4,484,979 | 11/1984 | Stocker | 156/643 |
| 4,581,100 | 4/1986 | Hatzakis et al. | 156/643 |
| 4,605,479 | 8/1986 | Faith, Jr. | 204/192.17 |
| 4,693,777 | 9/1987 | Hazano et al. | 156/643 |
| 4,825,808 | 5/1989 | Takahashi et al. | 118/723 |
| 4,866,346 | 9/1989 | Gaudreau et al. | 156/643 |

FOREIGN PATENT DOCUMENTS

| 052227 | 5/1982 | European Pat. Off. . |
| 157052 | 9/1985 | European Pat. Off. . |
| 242207 | 10/1987 | European Pat. Off. . |
| 53-62982 | 6/1978 | Japan | 118/723 |
| 60-249328 | 12/1985 | Japan | 118/712 |
| 61-179868 | 8/1986 | Japan | 118/723 |
| 62-20331 | 1/1987 | Japan | 437/228 |
| 62-221116 | 9/1987 | Japan | 118/723 |
| 62-221163 | 9/1987 | Japan | 156/643 |

OTHER PUBLICATIONS

Curran, J. E., "The Properties and Applications of Low Energy Plasmas", Vacuum, vol. 34, Nos. 3-4 (Mar.-Apr. 1984), pp. 343-345.
Eliot K. Broadbent, William T. Stacy, Solid State Technology, Dec. 1985, "Selective Tungsten Processing by Low Pressure CVD", pp. 51-59.
Yonhau Tzeng, Tsan H. Lin, 1046 Journal of the Electrochemical Society 133 (1986), Jul., No. 7, Manchester, N.Y., U.S.A., pp. 1443-1448.

Primary Examiner—Shrive Beck
Assistant Examiner—Terry J. Owens
Attorney, Agent, or Firm—Foley & Lardner

[57] ABSTRACT

An apparatus for forming a film on the silicon surface of an intermediate semiconductor device, wherein a silicon oxide film on the intermediate semiconductor device is etched out with an active species without damage to the silicon surface, the difference between the etching speeds of the silicon and the silicon oxide film being 5 or less. Immediately after the etching, another film is formed on the surface of the silicon without the surface being exposed to the atmosphere. Thus, the etching of the silicon oxide film and the forming of another film can be performed in the same chamber or different chambers.

12 Claims, 6 Drawing Sheets

5,067,437

APPARATUS FOR COATING OF SILICON SEMICONDUCTOR SURFACE

FIELD OF THE INVENTION

The present invention relates to a method of manufacturing semiconductor devices and an apparatus for practicing the method, wherein a silicon oxide film on the surface of an intermediate semiconductor device is etched out and then another film is deposited on the device.

BACKGROUND OF THE INVENTION

First Technique and Its Problems

In order to deposit polysilicon on the surface of, e.g., an intermediate semiconductor device at an intermediate stage of manufacturing processes by means of the reduced pressure chemical vapor deposition (CVD) method, it is necessary to chemically clean, prior to such deposition, the surface of a polysilicon layer on, or an impurity diffused layer in, the substrate. Thereafter, the substrate is washed or placed in atmosphere so that a very thin oxide film called a natural oxide film grows on the substrate surface. The oxide film grows further when the substrate is introduced into a reaction tube for deposition of a polysilicon film. Under such conditions, if a polysilicon film is deposited on the oxide film by the CVD method, a failure of the electric connection will occur. Such a problem is particularly serious where the underlying layer is a polysilicon layer. In order to avoid such failures, a so-called ion mixing method has been adopted whereby after the deposition of a polysilicon film on the substrate by the CVD method, ions are implanted to destruct the oxide film for achieving an electrical connection. This ion mixing method necessitates using an expensive ion implanting apparatus, and, in addition, the semiconductor device is subject to ion radiation damage.

There is a method where a silicon nitride film is deposited on a polysilicon film formed by the CVD method to use the former as a mask for field oxidation. Also in this method, film will grow on the polysilicon film. The presence of an oxide film between the polysilicon film and silicon nitride results in abnormal oxidation in many cases.

Second Technique and Its Problems

For the diffusion of impurities such as arsenic, boron, or the like into a silicon substrate, there is a method wherein a diffusion source such as polysilicon, silicon oxide or the like is deposited on the substrate to make impurities contained in the diffusion source diffuse into the substrate. In this method, if a silicon oxide film is present at the interface between the diffusion source and silicon substrate, then the silicon oxide film acts as a diffusion barrier that suppresses the diffusion of impurities into the silicon substrate.

If the silicon substrate is washed and thereafter exposed to the atmosphere prior to deposition of the diffusion source on a silicon substrate, a very thin oxide film will grow on the silicon substrate as described before. The presence of this oxide film makes it difficult to diffuse the impurities into the silicon substrate.

Third Technique and Its Problems

The selective CVD method is also known whereby W is selectively deposited on only silicon by using $WF_6$ and $H_2$. If silicon subjected to the selective CVD method has a thin oxide film thereon, W will not be deposited thereon. In addition, if the surface of silicon on which W is not deposited primarily is soiled, W will nevertheless be deposited but it will not be uniform in thickness. For these reasons, it is difficult to apply the selective CVD method.

As above, with the above-described techniques it is difficult in practice to form a new film on an intermediate semiconductor device without incuring an adverse effect from oxide films. Furthermore, an attempt remove such an oxide film will damage to the intermediate semiconductor device.

SUMMARY OF THE INVENTION

The present invention results from consideration of the above problems. It is an object of this invention to provide a method of manufacturing a semiconductor device and apparatus for use in practicing the method, capable of removing a silicon oxide film on an intermediate semiconductor device without damaging it, and then forming another film on the surface of the device.

The manufacturing method of this invention comprises the steps of: removing a surface oxide film on a surface material (silicon) of an intermediate semiconductor device, by using active species derived from a mixture of a gaseous halogen compound and gaseous oxygen, under the condition that the difference between the etching speeds of the surface material and the surface oxide film is made as small as possible by controlling the ratio of the flow of the gaseous oxygen to that of the mixed gas and the temperature of the intermediate semiconductor device; and forming another covering film on the surface of the surface material (silicon) with the surface oxide film removed therefrom.

The manufacturing apparatus of this invention comprises: first means for forming active species and second means for removing an oxide film and forming a covering film; the first means comprising a regulating means for regulating a flow ratio of gaseous oxygen gas to a gaseous halogen compound and a discharge means for forming active species based on the gases, with the second means comprising a casing (chamber) capable of introducing the active species therein for housing an object intermediate semiconductor device, a heating means for heating the intermediate semiconductor device to remove a surface oxide film on a surface material (silicon) of the intermediate semiconductor device by using the active species, a regulating means for regulating the temperature of the intermediate semiconductor device through control of the heating means, and a film forming means for forming a covering film on the surface material of the intermediate semiconductor device with the surface oxide film removed therefrom.

According to the manufacturing method of this invention, the flow ratio of the gaseous oxygen to a mixture gas of the gaseous oxygen and a gaseous halogen compound, and the temperature of an intermediate semiconductor device are both controlled. Therefore, it becomes possible to obtain the etching condition that a difference between the etching speeds of silicon and silicon oxide is made as small as possible. Under such an etching condition, an oxide film on the surface of an intermediate semiconductor device can be removed by using active species generated by the discharge in the mixed gas and without damaging the device. Another film is formed on the surface of the device. Since the surface of the device after removal of the oxide film is not exposed to the atmosphere, the other film can be reliably formed because the oxide film has been removed.

Removal of an oxide film is carried out properly where the etching speed ratio of silicon to silicon oxide, is less than or equal to 5.

The etching condition for the etching speed ratio less than or equal to 5, is obtained by satisfying the following formula:

$$Y \geq -0.13\,T + 106.3$$

where Y is a percent flow ratio of gaseous oxygen to the mixed gas, and T is the temperature (° C.) of an intermediate semiconductor device.

According to the present invention, the flow ratio of oxygen gas to a mixture of gaseous oxygen and a gaseous halogen compound and the temperature of an intermediate semiconductor device, are both controlled. Therefore, the etching condition of the difference of the etching speeds between silicon and silicon oxide being as small as possible, is easily satisfied. Under such conditions, an oxide film on the surface of an intermediate semiconductor device can be removed without damaging the device, and another film can be formed.

DETAILED DESCRIPTION OF THE PREFERRED EMBODIMENTS

The background to how the present invention has been made will be described prior to the description of the embodiments.

For removing a surface oxide film on an underlying film without damaging it, and under a reduced pressure atmosphere, the so-called chemical dry etching is the most suitable method by which etching is performed with active species generated by the discharge plasma. However, in the usual chemical dry etching, the etching speed of a certain material is generally very large when compared with that of an oxide of the material. For example, the etching speed of silicon is about 30 times as large as that of silicon oxide. Therefore, with this method, the underlying layer at the thin surface oxide film may be etched considerably while the surface oxide layer is removed, and so this method is not suitable for practical use. The present inventors have discovered the condition that the difference of the etching speeds between material and its oxide becomes considerably less even if such chemical dry etching is employed. Using this condition, an oxide film on the surface of an underlying layer can be removed properly.

Furthermore, after removing the surface oxide film, another film can be properly formed by using an apparatus for successively and sequentially depositing the film without degrading the property of a reduced pressure atmosphere so as to prevent the oxide film from re-growing and preventing surface grime.

The present invention has been made on the basis of the above viewpoint.

Some of the preferred embodiments of this invention will now be described hereinbelow.

1st Embodiment

In this embodiment, an apparatus is provided whereby an oxide film on the surface of an underlying silicon layer or underlying polysilicon layer is removed, and sequentially thereafter, polysilicon, silicon nitride, silicon oxide or the like, respectively containing therein impurities is, deposited. Given further are examples of applications of the apparatus to the manufacture of semiconductor devices.

Figure 1:
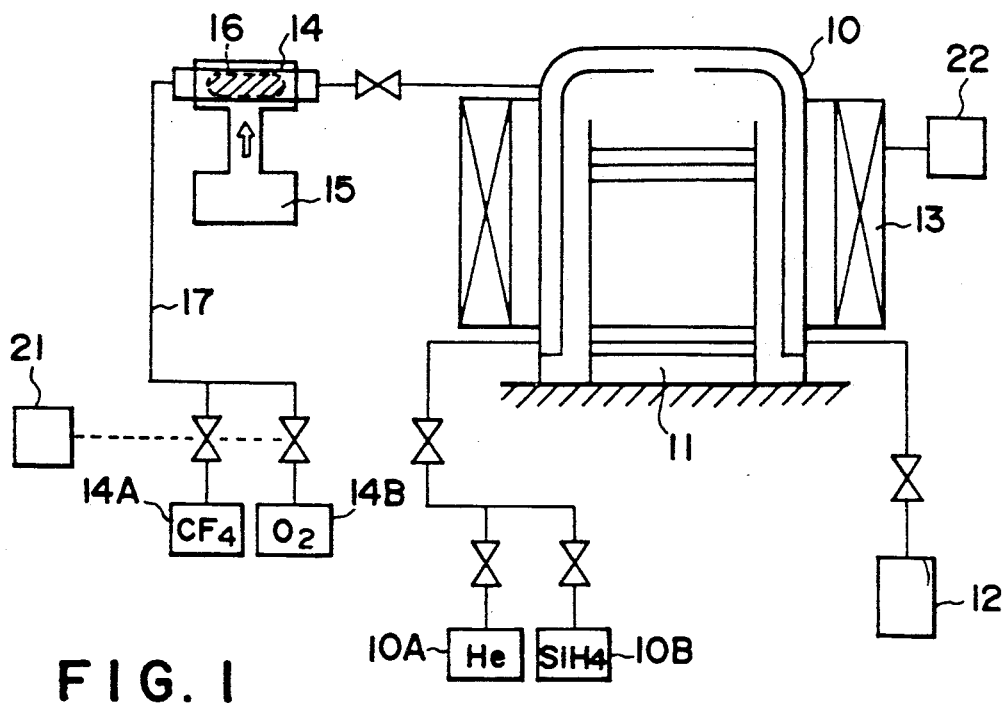
FIG. 1 is a schematic diagram showing the overall arrangement of the manufacturing apparatus according to a first embodiment of this invention.

FIG. 1 shows the outline of the manufacturing apparatus of the first embodiment whose function and use will be given hereinbelow. Specifically, an object substrate (silicon wafer) 11 is inserted into a quartz tube 10 serving as a deposition chamber. Next, the pressure within the quartz tube 10 is reduced with an exhaust pump 12, to introduce gaseous He and gaseous $SiH_4$ from a He gas source 10A and $SiH_4$ gas source 10B, respectively. Then, the wafer 11 within the tube 10 is heated to around 600° C. with an external heater 13. Then, a polysilicon film is deposited on the wafer 11. The above-described reduced pressure CVD apparatus is coupled to a plasma discharge chamber in which gaseous $CF_4$ and gaseous $O_2$ from a $CF_4$ gas source 14A and $O_2$ gas source 14B, respectively, can be introduced via an introduction tube 17. With the gases introduced within the discharge chamber 14, power is supplied from a microwave power source 15 to the discharge chamber 14 to generate a plasma 16 of the mixed gases. In FIG. 1, reference numeral 21 represents a flow regulator for regulating the flow ratio of $O_2$ to $CF_4$, and reference numeral 22 represents a temperature regulator for regulating the temperature of an intermediate semiconductor device within the tube 10 under control of the heater 13.

Practicing the method of this invention by using the above apparatus will be described in detail.

Figure 2:
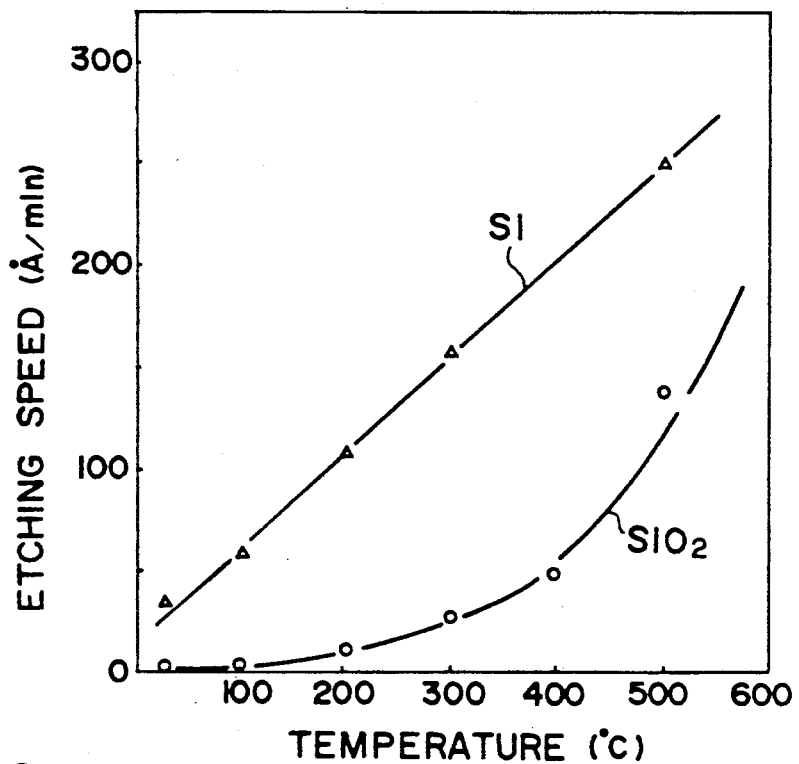
FIG. 2 is a graph showing the etching speeds of silicon (Si) and silicon oxide film ($SiO_2$) relative to temperature under microwave discharge plasma of a mixed gas of $CF_4$ and $O_2$.

First, a silicon wafer with a partially exposed polysilicon layer or a partially exposed diffused layer is subjected to cleaning, washing and drying processes using ordinary chemicals and thereafter, it is inserted into the quartz tube 10. The pressure within the tube 10 is reduced to about $10^{-2}$ Torr using the exhaust pump 12, with the temperature of the wafer being raised u to 600° C. Then, air within the discharge chamber 14 is exhausted using the exhaust pump 12 to introduce therein a $CF_4$ gas and an $O_2$ gas to about 0.1 Torr under the condition of a flow ratio O₂/(total gas flow) of about 50%. Microwave power is applied from the microwave power source 15 to the discharge chamber 14 to generate a plasma. Active species F* generated by the plasma are introduced into the deposition chamber 10. The etching speeds of Si and SiO₂ under the active species F* relative to the temperature of the wafer are shown in FIG. 2. Particularly, at the low temperature range (room temperature to 150° C.), a difference between the etching speeds of Si and SiO₂ is large, whereas at the temperature range over 400° C., the difference becomes small. Therefore, by applying the active species F* to the silicon wafer heated to 600° C., polysilicon diffused layer and oxide film thereof are etched for a time sufficient for etching the very thin silicon oxide film (50 to 100 Å) formed on the exposed polysilicon or the exposed diffused layer. In this case, these are etched to the same degree. Thus, the difference between the etching speeds of the polysilicon and diffused layer, and oxide film thereof can be substantially neglected. After etching the oxide film, the reduced pressure CVD method is performed using He gas and SiH₄ gas.

With the above apparatus, it becomes possible to deposit polysilicon on the surface of an underlying polysilicon layer or the like, after etching the surface oxide film without degrading the performance of reduced pressure atmosphere by sequentially employing the reduced pressure CVD method. Furthermore, polysilicon containing impurities can be deposited by using a gas containing impurities such as As, B, P and the like, or a silicon nitride film can be deposited by using ammonia.

2nd Embodiment

Next, the second embodiment of the apparatus which is a modification of the first embodiment will be described with reference to FIG. 3. The apparatus of the second embodiment has a reduced pressure CVD apparatus for deposition of a polysilicon or silicon nitride film, the surface processing chamber and film deposition chamber thereof being separately mounted.

An object wafer substrate similar to the first embodiment is transported into a load chamber 3-1 which is then subjected to vacuum exhaustion. Thereafter, a gate valve 3-2 is opened to move the wafer 3-3 to a cleaning chamber 3-4 as shown in FIG. 3. The cleaning chamber 3-4 is always maintained at reduced pressure by means of an air exhausting system 3-9. The temperature of the wafer 3-3 within the cleaning chamber 3-4 is rapidly raised to 600° C. by means of an infrared heater 3-5 through a quartz glass window 3-17. Thereafter, a valve 3-7 between the cleaning chamber 3-4 and discharge chamber 3-6 is opened, and a mixed gas of CF₄ and O₂ is introduced into the discharge chamber 3-6. Upon application of microwave power from a microwave power source 3-8 to the discharge chamber 3-6, discharge is initiated within the discharge chamber 3-6. Active species generated by such discharge are introduced into the cleaning chamber 3-4 to remove any silicon oxide film on the surface of the wafer 3-3, in the manner similar to the first embodiment. Thereafter, the valve 3-7 is closed so that the cleaning chamber 3-4 is again subjected to air exhaustion and pressure reduction by means of the air exhausting system 3-9. Then, a gate valve 3-11 is opened to transport the wafer to the deposition chamber 3-10, the inside of which is exhausted by the air exhausting system 3-19. The wafer 3-14 within the deposition chamber 3-10 is heated to about 600° C.

by means of an infrared heater 3-12 through a quartz glass window 3-18. SiH₄ and He are introduced by a gas introduction system 3-13 so that polysilicon is deposited on the wafer 3-14 by means of the reduced pressure CVD method.

The wafer 3-14 with polysilicon deposited thereon as above is transported into an unload chamber 3-16 via a gate valve 3-20. Thereafter, a gas introduction system 3-15 is caused to operate so that active species are introduced from the discharge chamber 3-6 to the deposition chamber 3-10 to therefore effectively remove polysilicon attached on the inner wall of the deposition chamber 3-10.

Figure 3:
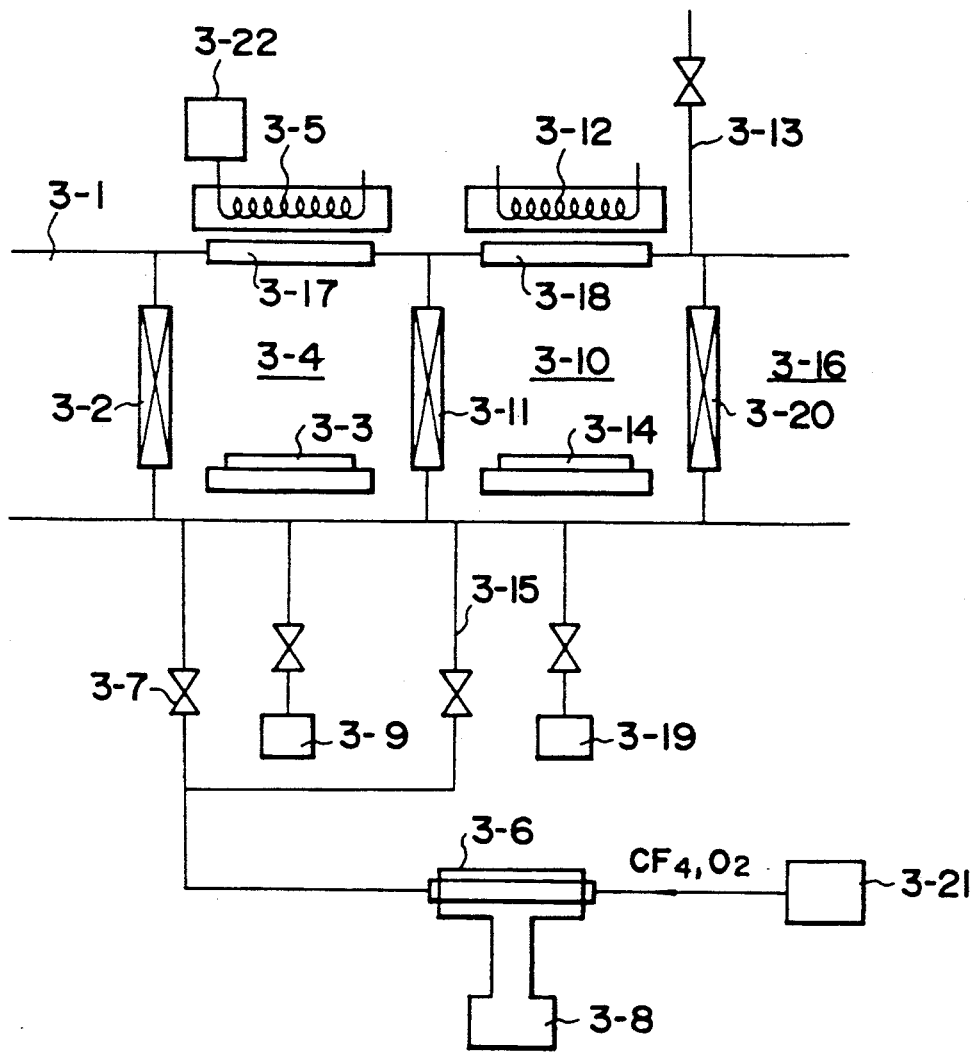
FIG. 3 is a schematic diagram showing the overall arrangement of the manufacturing apparatus according to a second embodiment of this invention.
Figure 8:
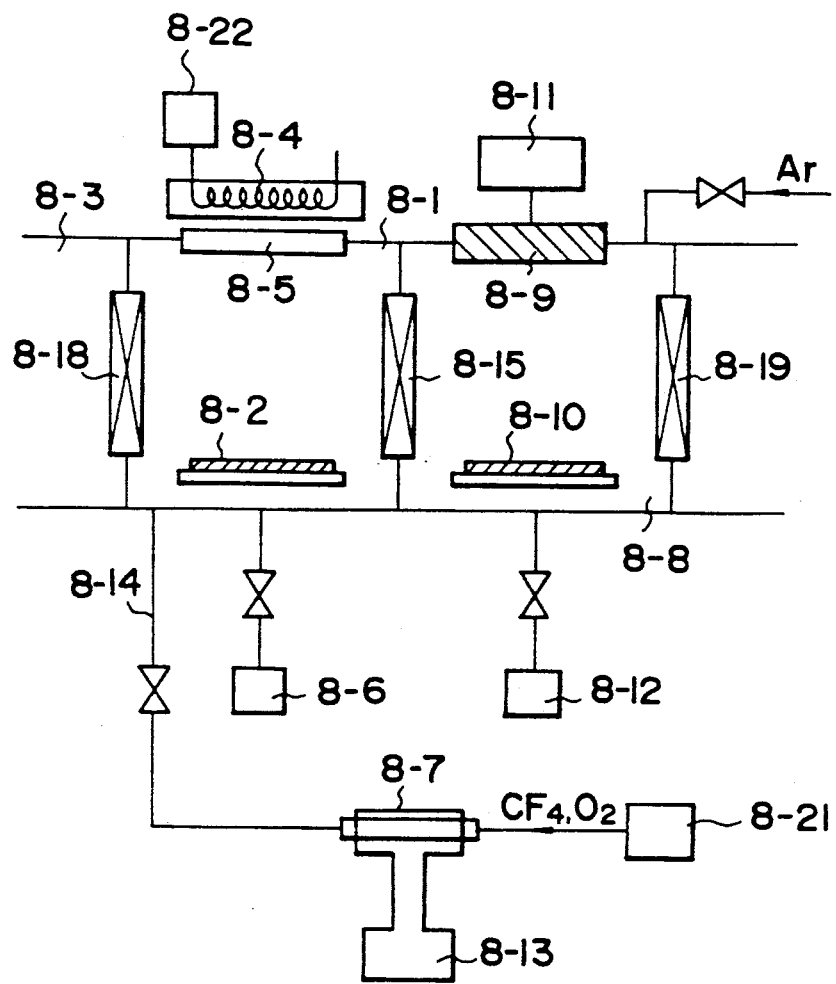
FIG. 8 is a schematic diagram showing the overall arrangement of the manufacturing apparatus according to a third embodiment of this invention.

In FIG. 3, reference numeral 3-21 represents a flow regulator for regulating the flow ratio of O₂ to CF₄ (flow regulator in FIG. 8 is indicated at 8-21, and in FIG. 10 at 10-21), and reference numeral 3-22 represents a temperature regulator for regulating the temperature of an intermediate semiconductor device during etching (temperature regulator in FIG. 8 is indicated at 8-22, and in FIG. 10 at 10-22).

In the second embodiment, the infrared heaters 3-5 and 3-12 have been used for heating the wafers 3-3 and 3-14, respectively. However, it is obvious that other heating means such as resistive wire heating means and induction heating means may also be used with the similar effects as above.

Furthermore, in the second embodiment, etching in the cleaning chamber 3-4 is carried out at a high temperature but cleaning may be carried out at lower temperatures, e.g., near room temperature if the ratio of O₂ to CF₄ of the gases to be introduced into the discharge chamber 3-6 is changed.

Figure 4:
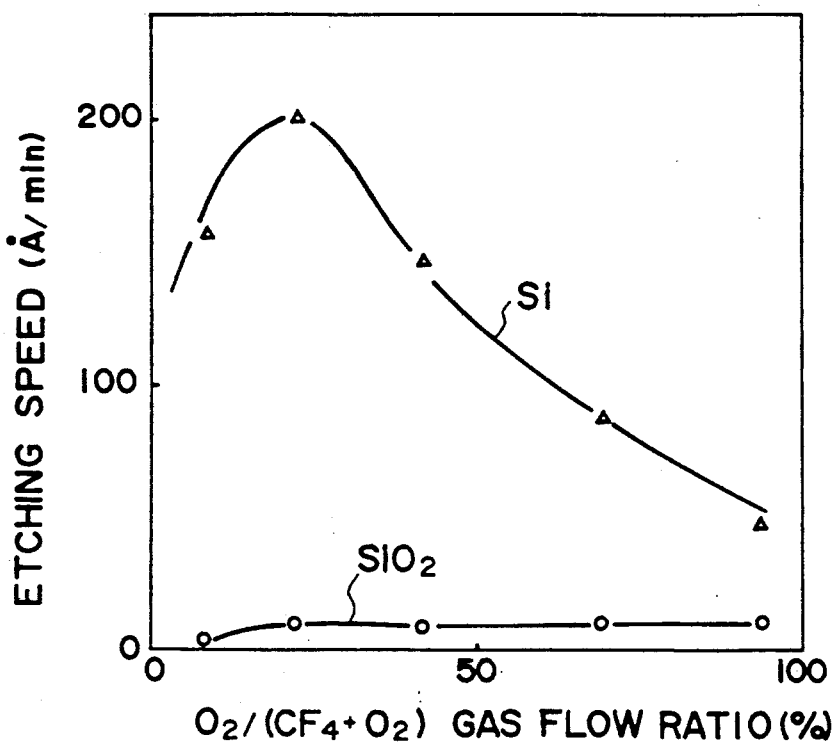
FIG. 4 is a graph showing the etching speeds of Si and $SiO_2$ under the microwave discharge plasma of a mixed gas of $CF_4$ and $O_2$ relative to the gas flow ratio $O_2/(CF_4 + O_2)$.

FIG. 4 illustrates a change in the etching speeds of polysilicon and silicon oxide film relative to the ratio of O₂ to (CF₄+O₂) at room temperature. As seen from FIG. 4, as the amount of O₂ increases, the difference between the etching speeds of Si and SiO₂ becomes correspondingly small. A relatively large amount of O₂ allows an oxide film on the silicon surface to be properly removed even at room temperature.

Figure 5:
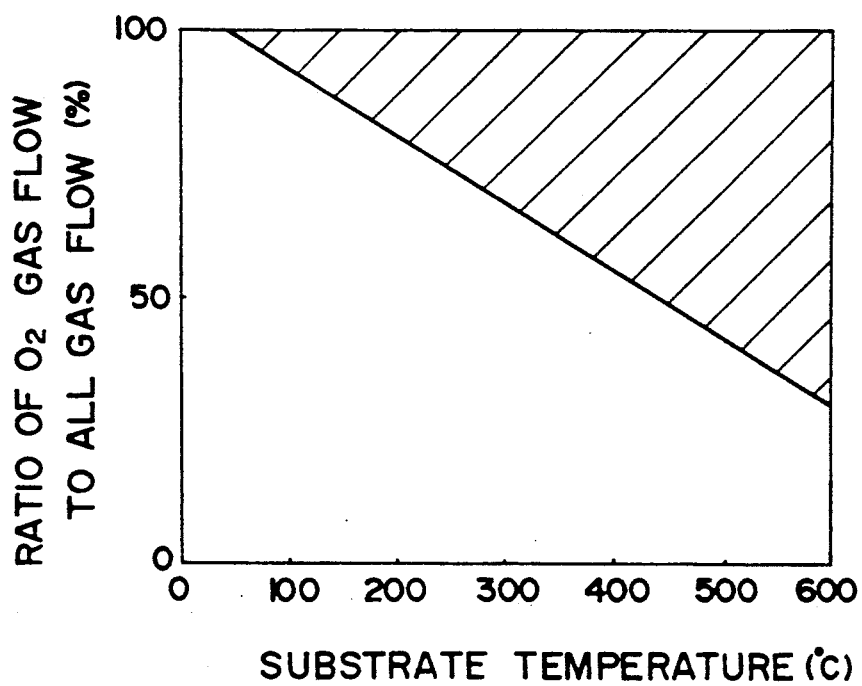
FIG. 5 is a graph showing the etching condition region within which the ratio of substrate material to an oxide thereof becomes less than or equal to 5.

A significant point in the surface processing described in the second embodiment is that the difference between the etching speeds of silicon and silicon oxide is made as small as possible. The present inventors have thoroughly studied the etching of oxide films by using a mixed gas of a gaseous halogen compound and gaseous oxygen and have discovered that the gas flow ratio and temperature are important parameters. Taking into consideration the thickness of an oxide film and uniformity of etching, it can be judged that a practical value for the etching speed ratio of silicon to silicon oxide, is 5 or less. The region satisfying such a condition is indicated by oblique lines in FIG. 5. This region is given by the following formula:

$$Y \geq -0.13\,T + 106.3$$

where Y is a flow ratio in percent of the O₂ gas to the total gas, and T (° C.) is the temperature of a substrate. As appreciated from the region indicated by oblique lines in FIG. 5, proper etching is possible even if the substrate temperature is lowered, under the condition that the amount of oxygen gas is increased. Therefore, proper etching at the room temperature may be carried out with a suitable flow ratio.

Figure 6A:
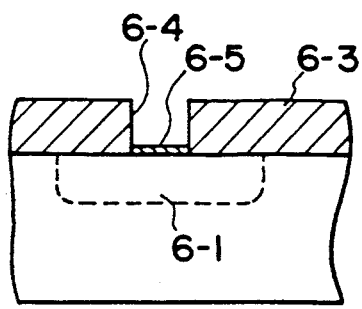
FIGS. 6a to 6d and FIGS. 7a and 7b are cross sectional views showing some of the manufacturing steps performed by the apparatus of the first or second embodiments.
Figure 6B:
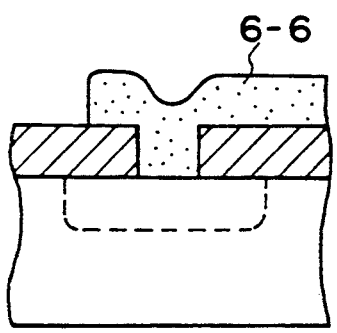
Figure 6C:
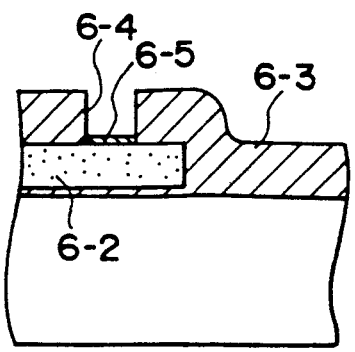
Figure 6D:
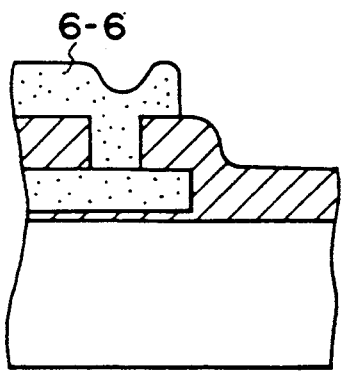

Next, examples of applications of the above embodiments to the manufacturing processes of practical FIGS. 6a to 6d, which schematically show the processes of making polysilicon containing impurities come into contact with an underlying silicon diffused layer 6-1 (FIGS. 6a and 6b) and with an underlying polysilicon layer containing impurities 6-2 (FIGS. 6c and 6d). In conducting such processes, insulating layers 6-3 such as a silicon oxide film are deposited on the underlying diffused layer 6-1 or on the underlying polysilicon layer 6-2. Thereafter, contact holes 6-4 are formed above the insulating layers 6-3 for deposition of conductive polysilicon. During these processes, thin natural oxide films 6-5 may grow on the surface of the polysilicon layer 6-2 or silicon diffused layer 6-1. The oxide film 6-5 is likely to grow more impurities are contained in the underlying silicon or polysilicon layers. Electrical connections are not ensured even if polysilicon is deposited on the oxide film 6-5 but in this case, by using the embodiment apparatus, the oxide film 6-5 can be removed properly. Immediately after this removal, upper polysilicon layers 6-6 can be deposited in the succeeding process to therefore allow satisfactory electrical connections (FIGS. 6b and 6d).

Figure 7A:
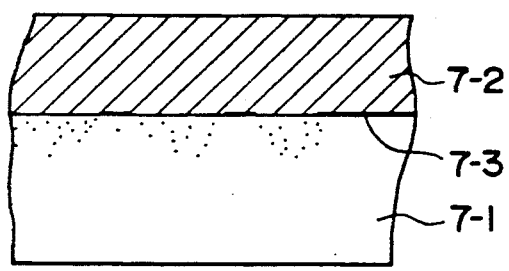
Figure 7B:
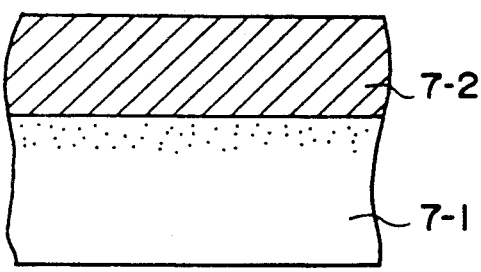

Other applications of the above embodiments to a process of diffusing impurities into a silicon substrate are shown in FIGS. 7a and 7b. As shown in FIG. 7a, a silicon oxide 7-2 containing impurities such as As, P and B is deposited on a silicon substrate 7-1. Thereafter, the impurities within the silicon oxide 7-2 are diffused into the silicon substrate 7-1 by means of heat treatment. If an oxide film 7-3 is present on the surface of the substrate 7-1 during the above processes, the diffusion at that portion is hindered (FIG. 7a). However, by using the above embodiments, it becomes possible to diffuse impurities into the silicon substrate 7-1 uniformly as shown in FIG. 7b.

The above embodiments are applicable to a silicon nitride film forming process, although this is not shown. In this process, a silicon oxide film, polysilicon and silicon nitride film are deposited on a silicon substrate in this sequence. Next, the silicon nitride film is patterned in a predetermined shape to use it as a selective oxidation mask for forming a field region (field oxide film). Upon application of the above embodiments to this process, the oxide film inevitably formed on the polysilicon at the process of depositing the silicon nitride on the polysilicon can be removed so that abnormal oxidation during field oxidation can be avoided to therefore allow the formation of fine field regions.

Third Embodiment

A third embodiment is shown in FIG. 8 wherein the above-described cleaning means is mounted on a sputtering apparatus having a load lock mechanism.

Referring to FIG. 8, an object silicon wafer substrate 8-2 is transported from a load chamber- 8-3 into an airtight cleaning chamber 8-1. The wafer 8-2 is heated by an external infrared heater 8-4 through a quartz glass window 8-5. The cleaning chamber 8-1 is adapted to produce a vacuum by means of an air exhaust pump 8-6. The cleaning chamber 8-1 is coupled to a discharge chamber 8-7 which has a structure similar to the discharge chamber 3-6 shown in FIG. 3. A deposition chamber 8-8 for performing ordinary sputtering is mounted next to the cleaning chamber 8-1. For the deposition chamber 8-8, there are provided a sputtering target 8-9, a silicon wafer 8-10 facing the target, a d.c. power source 8-11 for use in generating plasma from the front surface of the target by using gaseous Ar, and an air exhaust pump 8-12 to produce a vacuum of the chamber. Reference numeral 8-13 represents a microwave power source, and 8-15, 8-18 and 8-19 represent a gate valve.

Next, the operation of the apparatus will be described. First, an object wafer 8-2 is transported from the load chamber 8-3 into the cleaning chamber 8-1 as shown in FIG. 8. The inside of the load cleaning chamber 8-1 and discharge chamber 8-7 is made a high vacuum state because of air exhaustion by an air exhaust system 8-6. Thereafter, a mixture gases of $Cl_2$, $NF_3$ and $O_2$ is introduced into the discharge chamber 8-7 at about 0.1 Torr, and microwave power is supplied thereto from the microwave power source 8-13. Then, discharge occurs within the discharge chamber 8-7 so that a number of active species are generated within the discharge chamber 8-7. The active species are introduced via an introduction system 8-14 into the cleaning chamber 8-1. The wafer 8-1 within the cleaning chamber 8-1 has been heated with the infrared heater 8-4 to have a temperature of about 450° C. at the wafer surface. At this high temperature, a silicon oxide film on the surface of the wafer 8-2 can be easily etched out with the active species containing the radical of Cl or F. The reaction speeds of silicon and silicon oxide with the active species are substantially equal to each other at such a high temperature. Therefore, the underlying silicon is scarcely damaged while removing the thin silicon oxide film formed thereon. After completion of the above cleaning processes, the gate valve 8-15 is opened to transport the wafer 8-2 into the deposition chamber 8-8 to deposit an aluminum film for Al wiring on the silicon surface by means of sputtering. It was confirmed that the yield (provability) of electric connection between the underlying first layer and the Al wiring second layer improved remarkably.

The cleaning chamber 8-1 and deposition chamber 8-8 have been provided separately in the apparatus shown in FIG. 8. However, they may be united into a single chamber to perform cleaning and deposition continuously and sequentially. Particularly in such a case, when a wafer is transported into a reaction chamber (single chamber), the reaction chamber is exhausted to a vacuum and simultaneously; therewith, the wafer is heated. Then, active species are introduced into the reaction chamber to remove an alumina layer 9-4 formed on an Al wiring first layer 9-1. Thereafter, the reaction chamber is again exhausted to create a high vacuum. Then, a gas such as Ar is introduced to deposit an Al wiring second layer through D.C. discharge sputtering.

4th Embodiment

A fourth embodiment will be described with reference to FIG. 9, which uses a cold wall type, reduced pressure CVD apparatus with a load lock mechanism. A cleaning chamber 10-1 of the apparatus shown in FIG. 9 has the same structure as the cleaning chamber 8-1 shown in FIG. 8. A deposition chamber 10-2 for selective CVD of tungsten is mounted next the cleaning chamber 10-1. For the deposition chamber 10-2, there are provided an air exhaust pump 10-3, infrared heater 10-4, and quartz glass window 105 adapted so as to introduce $WF_6$ and $H_2$. Reference numeral 10-6 represents an air exhaust pump, 10-8 a microwave power source, 10-9 an infrared heater, 10-10 a quartz glass window, 10-11 a load chamber, 10-12 and 10-13 a wafer, and 10-15 to 10-17 a gate valve.

Next, processing a wafer by the apparatus will be described. First, a silicon wafer with or without contact holes formed therein (refer to hole 6-4 in FIG. 6a) is subjected to cleaning, washing and drying processes using ordinary chemicals and thereafter, transported into the cleaning chamber 10-1 into which active species generated within the discharge chamber 10-7 are introduced.

A thin natural oxide film (refer to film 6-5 in FIG. 6a) formed on the silicon surface exposed to atmosphere at the bottom of contact hole can be easily etched out with the active species. Therefore, the silicon surface (refer to surface 6-1 in FIG. 6a) becomes clean without an oxide film. Alternatively, in the case of a silicon wafer without contact holes, the silicon surface is covered with a silicon oxide film which has been soiled considerably mainly due to organic substances, typically vacuum pump oil. However, the active species generated from the mixed gas of $CF_4$ and $O_2$ effectively etch out such organic substances. In addition, the active species slightly etch out the silicon oxide film so that the contaminated layer on the silicon surface can be completely removed and therefore expose an original, clean silicon oxide film.

Under such conditions, the inside of the cleaning chamber 10-1 is exhausted by means of the air exhaustion pump 10-6, and the wafer 10-12 is transported into the deposition chamber 10-2 which has been previously maintained at a vacuum by means of the air exhaust pump 10-3 so that the surface of the wafer 10-13 can be maintained clean. A mixture gas of $WF_6$ and $H_2$ is introduced into the deposition chamber 10-2 to selectively deposit W onto contact holes using the ordinary deposition conditions.

During the above processes, the surfaces of the silicon and silicon oxide film are maintained sufficiently clean for presenting their intrinsic performance, so that selective deposition of W sensitive to the surface condition can be realized.

Similar to the modification of the apparatus shown in FIG. 8, the above processes may be carried out in time sequence by using a single reaction chamber instead of two chambers 10-1 and 10-2.

Furthermore, the discharge chamber may be mounted on an epitaxial growing deposition apparatus wherein dry cleaning the deposition surface is performed, prior to the deposition, at relatively low temperature of 500° to 600° C. using active species and thereafter, epitaxial growing is effected.

Figure 9:
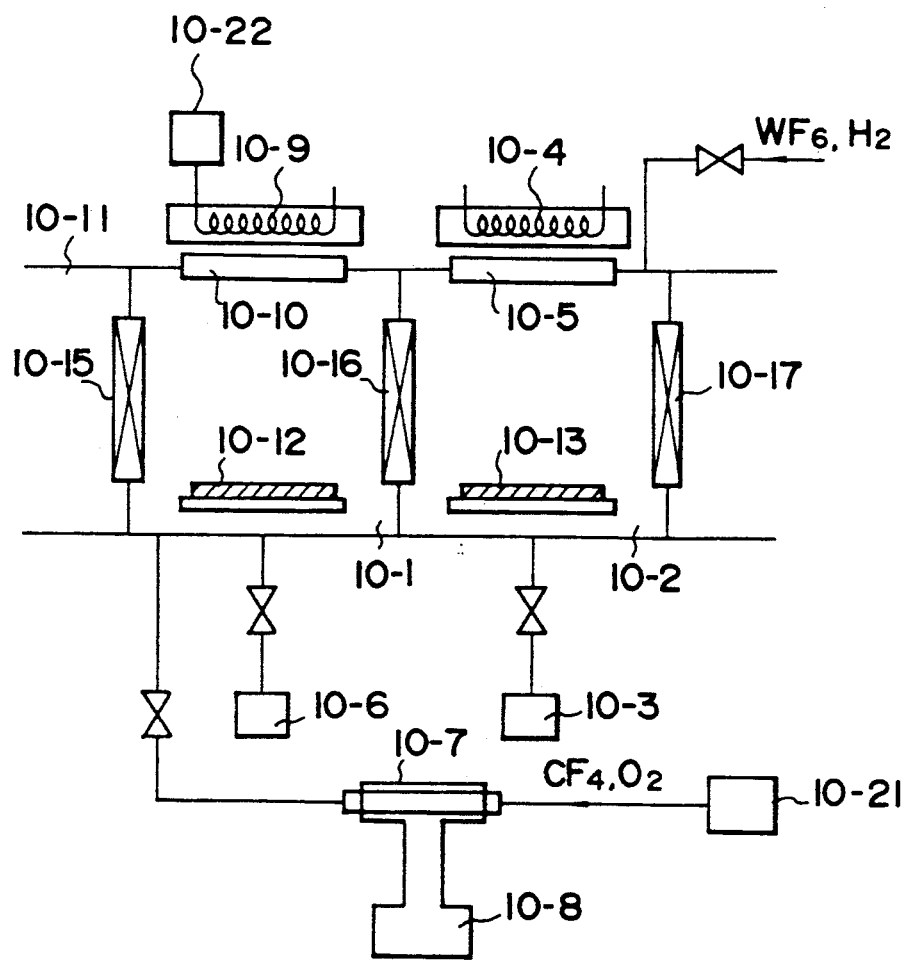
FIG. 9 is a schematic diagram showing the overall arrangement of the manufacturing apparatus according to a fourth embodiment of this invention.

For the processes by the apparatus shown in FIGS. 3, 8 and 9, the description has been directed to the case where an oxide film on the surface of silicon or aluminum is removed using $CF_4$, $NF_3$ or $Cl_2$. However, the present invention is also applicable to other underlying materials such as high melting point metal, silicon compounds and the like, so long as the processes are performed for the purpose of improving contact between the underlying and overlaid layers by removing an oxide film or improving the overlaid film quality. In addition, other halogen compound gases such as $CHF_3$, $CFCl_3$ and the like may be used.

5th Embodiment

Even if a silicon substrate has been cleaned to expose the clean silicon surface, the silicon surface is again subjected to contamination if it is exposed to atmosphere, through adsorption of hydrocarbon mist, sulfuric acid mist, hydrochloric acid mist or oil mist, in the atmosphere. Therefore, after such adsorption of impurities, a satisfactory oxide film such as a thin oxide film of a gate oxide film may sometimes be impossible to grow on the impurities. To avoid such adsorption of impurities, an example of an oxidation apparatus with the above-described cleaning method applied thereto will be described.

The apparatus shown in FIG. 1 is used in this example. A substrate is inserted into the quartz tube 10 which is then subjected to pressure reduction. Thereafter, the silicon substrate is cleaned in the manner similar to the foregoing description. Then, an oxidizing gas such as $O_2$ or $H_2O$ is introduced into the quartz tube 10 to oxidize the silicon and grow a silicon oxide film. The grown silicon oxide film can be used as a gate oxide film having a good breakdown voltage.

What is claimed is:

1. An apparatus for forming a covering film on the silicon surface of an intermediate semiconductor device, comprising:
    first means for forming an active species, and
    second means for removing an oxide film and forming a covering film;
    said first means being a flow ratio regulating means for regulating a flow ratio of gaseous oxygen to a gaseous halogen compound, and discharge means for forming an active species from said gases;
    said second means including a casing for housing an intermediate semiconductor device formed of silicon and for introducing said active species, a heating means for heating said intermediate semiconductor device to remove a silicon oxide film formed on said silicon surface of the intermediate semiconductor device by using said active species, temperature regulating means for regulating the temperature of said intermediate semiconductor device, and film forming means for forming a covering film on said silicon surface of said intermediate semiconductor device after said silicon oxide film has been removed therefrom;
    said flow ratio regulating means and said temperature regulating means cooperatively regulating said flow ratio and said temperature, respectively, the ratio of the etching speeds of said silicon and said silicon oxide film being 5 or less.

2. An apparatus according to claim 1, further comprising means for reducing the pressure within said casing.

3. An apparatus according to claim 1, wherein said film forming means comprises means for introducing a gas into said casing for the deposition of material on said silicon surface of said intermediate semiconductor by the CVD method.

4. An apparatus according to claim 1, wherein said casing is divided into a first chamber for removing said silicon oxide film and a second chamber for performing said covering film forming.

5. An apparatus according to claim 4, wherein said second chamber comprises said film forming means and said film forming means is a means for performing sputtering.

6. An apparatus according to claim 1, wherein said casing comprises one chamber for removing said silicon oxide film and for performing said film forming, sequentially.

7. An apparatus according to claim 1, wherein said flow ratio regulating means and said temperature regulating means regulate said flow ratio and said temperature, respectively, so as to satisfy the following formula:

$$Y \geq -0.13T + 106.3$$

where Y is a percent flow ratio of said oxygen gas to said mixed gas, and T is the temperature (° C.) of said intermediate semiconductor device.

8. An apparatus according to claim 7, further comprising means for reducing the pressure within said casing.

9. An apparatus according to claim 7, wherein said film forming means comprises means for introducing a gas into said casing for the deposition of material on said silicon surface of said intermediate semiconductor by the CVD method.

10. An apparatus according to claim 7, wherein said casing is divided into a first chamber for removing said silicon oxide film and a second chamber for performing said film forming.

11. An apparatus according to claim 10, wherein said second chamber comprises said film forming means and said film forming means is a means for performing sputtering.

12. An apparatus according to claim 7, wherein said casing comprises one chamber both for removing said silicon oxide film and for performing said film forming, sequentially.

* * * * *